United States Patent
Sobelman et al.

[11] Patent Number: 6,020,754
[45] Date of Patent: Feb. 1, 2000

[54] LOOK UP TABLE THRESHOLD GATES

[75] Inventors: Gerald Edward Sobelman, Minnetonka; David Parker, St. Paul; Karl M. Fant, Minneapolis, all of Minn.

[73] Assignee: Theseus Logic, Inc., Orlando, Fla.

[21] Appl. No.: 09/050,375

[22] Filed: Mar. 31, 1998

Related U.S. Application Data

[63] Continuation-in-part of application No. 08/867,675, Jun. 6, 1997, which is a continuation of application No. 08/711,232, Sep. 9, 1996, Pat. No. 5,656,948, which is a continuation of application No. 08/368,811, Jan. 6, 1995, abandoned, which is a continuation-in-part of application No. 08/318,510, Oct. 5, 1994, Pat. No. 5,664,211, which is a continuation-in-part of application No. 08/220,636, Mar. 31, 1994, Pat. No. 5,664,212, which is a continuation of application No. 08/074,288, Jun. 8, 1993, Pat. No. 5,305,463, which is a continuation of application No. 07/702,016, May 17, 1991, abandoned.

[51] Int. Cl.⁷ ................................................. H03K 19/23
[52] U.S. Cl. ..................... 326/35; 326/37; 395/500.17; 395/500.18
[58] Field of Search ............................. 326/35–36, 59–60, 326/37, 39, 11; 395/500.17, 500.18

[56] References Cited

U.S. PATENT DOCUMENTS

| | | |
|---|---|---|
| 4,845,633 | 7/1989 | Furtek . |
| 5,305,463 | 4/1994 | Fant et al. ................................. 712/36 |

FOREIGN PATENT DOCUMENTS

| | | |
|---|---|---|
| 0566739 A1 | 10/1993 | European Pat. Off. . |
| 0570584 A1 | 11/1993 | European Pat. Off. . |
| 0578821 A1 | 1/1994 | European Pat. Off. . |
| WO92/12498 | 7/1992 | WIPO . |
| WO92/16971 | 10/1992 | WIPO . |
| WO94/03929 | 2/1994 | WIPO . |

OTHER PUBLICATIONS

David E. Muller, Asynchronous Logics and Application to Information Processing, Stanford University Press, Switching Theory in Space Technology, pp. 289–297, 1963.

Narinder Pal Singh, A Design Methodology For Self–Timed Systems, Massachusetts Institute of Technology, MIT/LCS/TR–258, Feb. 1981.

T.S. Anatharaman, A Delay Insensitive Regular Expression Recognizer, Dept. of Computer Science, Carnegie–Mellon University, CMU–CS–89–109, Jan. 1989.

Jens Sparso, et al., Design of Delay Insensitive Circuits Using Multi–Ring Structures, European Design Automation Conference, IEEE 0–8186–2780, pp. 15–20, Aug. 1992.

Lawrence G. Heller, et al., Cascode Voltage Switch Logic: A Different CMOS Logic Family, ISSCC 84 Digest of Technical Papers, IEEE, pp. Feb. 16–17, Feb. 1984.

(List continued on next page.)

*Primary Examiner*—Jon Santamauro
*Attorney, Agent, or Firm*—Steptoe & Johnson LLP

[57] ABSTRACT

A programmable gate array is disclosed for implementing asynchronous logic. In one embodiment, the array includes a set of cells, at least one of which is programmed to function as a threshold gate having a plurality of inputs, an output, and a threshold value. Signals may assume a DATA state having a logic meaning and a NULL state that has no logic meaning. The gate output switches to NULL when all inputs are NULL, and switches to the ASSERTED state when the number of DATA inputs exceeds the threshold value. The gate preferably exhibit hysteresis such that the output remains DATA while the number of DATA inputs remains greater than zero, and less than the threshold value. In an alternate embodiment, and array of simplified threshold elements is used to form more complex threshold gates.

1 Claim, 3 Drawing Sheets

OTHER PUBLICATIONS

Wojcik et al., On the Design of Three Valued Asynchronous Modules, IEEE Transaction on Computers, Oct. 1980, vol. C–29, No. 10, pp. 889–898.

Shibata et al., A Functional MOS Transistor Featuring Gate–Level Weighted Sum and Threshold Operations, IEEE Transactions On Electron Devices, Dec. 1992, vol. 39, No. 6, pp. 1444–1445.

Mark Edward Dean, Strip: A Self–Timed Risc Processor, Jun. 1992.

M.R. Greenstreet, T.E. Williams, and J. Staunstrup, Self–Timed Iteration, Elsevier Science Publishers B.V. (North–Holland), IFIP, 1988, pp. 309–322.

Teresa H.–Y. Meng, Robert W. Brodersen, and David G. Messerschmitt, Automatic Synthesis of Asynchronous Circuts from High–Level Specifications, IEEE Transactions on Computer–Aided Design, vol. 8, No. 11, Nov. 1989, pp. 1185–1205.

Ted Williams, Latency and Throughput Tradeoffs in Self––Timed Speed–Independent Pipelines and Rings, Stanford University Technical Report No. CSL–TR–91–482, May 1991.

Jens Sparso and Jorgen Staunstrup, Delay–insensitive multi–ring structures, Integration, the VLSI Journal 15, 1993, Elsevier Science Publishers B. V., pp. 313–340.

Tzyh–Yung Wuu and Sarma B.K. Vrudhula, A Design of a Fast and Area Efficient Multi–Input Muller C–element, IEEE Transactions on VlSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingcha Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self–Timed Rings and Their Application to Division, Stanford University Technical Report No. CSL–TR–91–482, May 1991.

Stephen H. Unger, Asynchronous Sequential Switching Circuits, 1969, pp. 221–229.

Carver Mead & Lynn Conway, Introduction to VLSI Systems, 1980, pp. 242–262.

Ivan E. Sutherland, Micropipelines, Communications of the ACM, Dec. 1989, vol. 32, No. 6.

Hampel et al., Threshold Logic, IEEE Spectrum, May 1971, pp. 32–39.

6,020,754

LOOK UP TABLE THRESHOLD GATES

This application is a continuation-in-part of application Ser. No. 08/867,675, filed Jun. 6, 1997, which is a continuation of application Ser. No. 08/711,232, filed Sep. 9, 1996, now U.S. Pat. No. 5,656,948, which is a continuation of application Ser. No 08/368,811, Jan. 6, 1995 now abandoned, which is a continuation in part of application Ser. No. 08/318,510, filed Oct. 5, 1994, now U.S. Pat. No. 5,664,211, which is a continuation in part of application Ser. No. 08/220,636, filed Mar. 31, 1994, now U.S. Pat. No. 5,664,212, which is a continuation of application Ser. No. 08/074,288, filed Jun. 8, 1993, now U.S. Pat. No. 5,305,463, which is a continuation of application Ser. No. 07/702,016, filed May. 17, 1991, abandoned, all of which are incorporated herein by reference in their entireties.

FIELD OF THE INVENTION

The present invention relates to the field of electronics, and in particular to the use of look-up-table-based field programmable gate arrays for implementing asynchronous threshold gates.

BACKGROUND

Previous logic systems, such as Boolean logic systems, have employed clocking signals to regulate the sequential processing of binary logic signals. Typically, a combinational logic circuit will respond to multiple inputs to generate an output. As input logic signals propagate through the circuit, the circuit output is unreliable for a period of time corresponding to the worst case propagation delays through the individual logic gates. Typically, the output signal is sampled at a time when the output is stable, often by latching the output into a register. The sampling time is set according to an independent clock signal, i.e., one that is not derived from the states of the logic gates themselves.

Asynchronous circuits have been proposed that are intended to operate without an independent clock. One asynchronous logic paradigm is disclosed in U.S. Pat. No. 5,305,463 ("NULL Convention Logic"). That paradigm uses logic gates referred to as threshold gates. Within this class, circuits are made with gates having varying numbers of inputs and varying threshold values. Such gates exhibit a switching characteristic in which an output switches from a first state, referred to as NULL, to a second state, referred to as DATA, when a number of inputs in the DATA state equals or exceeds a threshold value. It is desirable for such gates to remain in the DATA state until all gate inputs (or all inputs to a combinational circuit of which the gate is a part) return to NULL. This characteristic of holding an output in a DATA state until all inputs return to NULL is referred to here as "hysteresis."

It is desirable to have a complete family of threshold gates available for rapid prototyping and testing of multi-gate asynchronous circuits, especially threshold gates with hysteresis. Field Programmable Gate Array devices having cells especially-adapted with threshold gate functional blocks are one option, however, a faster and more readily available approach to implementing a wide variety of threshold gates is desirable.

SUMMARY OF THE INVENTION

Presently-available Field Programmable Gate Arrays (FPGAs) with cells designed for clocked Boolean logic, such as the 4000-series chips offered by Xilinx, can be programmed using look-up tables to perform clocked Boolean logic operations. These devices can be adapted to function as asynchronous threshold gates with hystersis. Such an adaptation involves two aspects. First, the look-up table or other programmable logic unit is programmed to implement a given threshold function. Second, a feedback connection (which may be internal or external to the device) is made to establish the desired hysteresis behavior.

Programmable logic blocks in FPGAs generally have a set of address inputs lines, Ai, and at least one data output line, D. Look-up tables map input states to output states. In this disclosure, look-up table address bits will be labeled as An, . . . , A2, A1, A0, where A0 is the least-significant bit. Because of the feedback connection, the data output line drives one of the address input lines. The set of address input lines that are not driven by the data output line will be referred to as the "external inputs." Thus, if there are N address lines, there will be $2^N$ address locations (input status) in the look-up table and N−1 external inputs.

In general, programmable gate arrays may be either Field Programmable Gate Arrays (FPGAs) or Mask Programmable Gate Arrays (MPGAs). In the former case, the circuits are programmed using electrical signals after the fabrication process has been completed. In the latter case, the circuits are programmed when the fabrication cycle has only been partially completed by completing the last set of processing steps using customized masks. The array and look up table architectures of the present invention may be used with both FPGA and MPGA implementations. These architectures can be used to implement a wide variety of threshold gates and larger circuits made from such gates.

BRIEF DESCRIPTION OF THE DRAWINGS

The present invention will be described below with reference to the attached drawings in which.

DESCRIPTION OF THE PREFERRED EMBODIMENTS

A wide variety of circuit-level implementations of threshold gates are disclosed in other applications and patents referenced herein, such as U.S. patent application Ser. No.

08/867,675 ("NULL Convention Threshold Gate"). Those gates can be used as building blocks for larger circuits in which signals may assume a first state that has a logical meaning, and a second state that has no logical meaning. The first state is referred to as DATA, while the second state is referred to as NULL. For example, a ground voltage state can be assigned the NULL state, and a power supply voltage state (such as +5 volts) can be assigned the DATA state. The voltage state assignment can be reversed, so that a ground voltage represents the DATA state, and the power supply voltage represents NULL.

Threshold gates provide logic primitives for logic signal processing. Larger circuit structures, such as combinational logic, sequential logic, adders, registers, busses, etc., can be formed using threshold logic (rather than Boolean logic). Furthermore, such circuits can operate asynchronously (without a synchronizing clock).

Threshold gates can be described functionally in terms of a number of inputs, a threshold, and certain switching characteristics. For example, a gate with four inputs might switch its output to a meaningful (DATA) state when three inputs are in the meaningful (DATA) state. Such a gate might hold its output in a meaningful (DATA) state until all inputs return to the NULL state, or until a reset signal drives the gate to the NULL state. For ease of notation, threshold gates are referred to as "M-of-N" gates, where "N" designates the number of inputs, and "M" designates the threshold number.

Additional threshold gates are disclosed in U.S. application Ser. No. 09/004,336, Null Convention Logic Gates with Flash, Set, and Reset capability, which is incorporated herein by reference in its entirety. Those gates can further be described functionally in terms of set and reset capability, and an ability to drive a group of threshold gates to a NULL output state simultaneously.

The threshold gates described herein include M-of-N gates with hysteresis. They can also include set and reset capability. The threshold gates described herein are implemented using a class of programmable electronic device known as Field Programmable Gate Array ("FPGA"). Two preferred types of FPGA devices, manufactured by Xilinx Corporation, are designated as the XC4000E and XC4000X series Field Programmable Gate Arrays. The devices are customized by loading configuration data into internal memory cells. The manufacturer also offers software to assist in designing, programming, and testing devices. Additional information is available to the public and can be found, for example, in the XC4000E and XC4000X Series Field Programmable Gate Arrays Product Specification which is incorporated herein by reference in its entirety. A brief description is included here for convenience.

Figure 9:
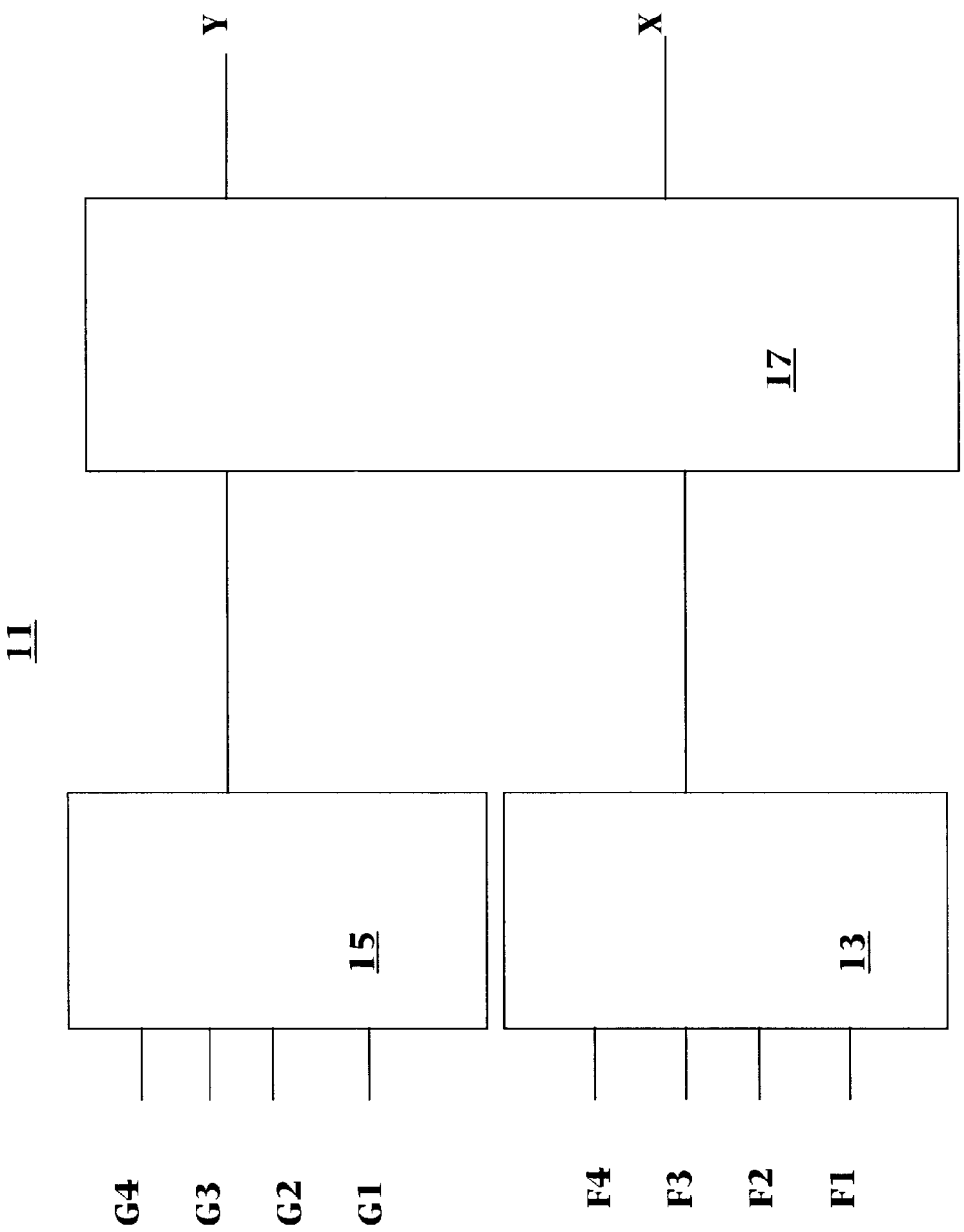
FIG. 9 illustrates selected internal elements of a XC4000 series FPGA.

FIG. 9 illustrates selected elements of a XC4000 series FPGA. The FPGA device 11 includes two function generators 13, 15. The first function generator 13 has four data inputs F1, F2, F3, F4, and a data output X. The second function generator 15 has four data inputs G1, G2, G3, G4, and a data output Y. Interconnection circuitry 17 allows the two function generators to operate collectively as a single, eight-input device. The device also includes a clock input K which may be tied to a fixed voltage level, such as ground.

Each function generator can be programmed by loading Configuration Data. Configuration data is expressed as a table that designates a desired output for each combination of inputs. A four input function generator is capable of having sixteen different input combinations.

Figure 1:
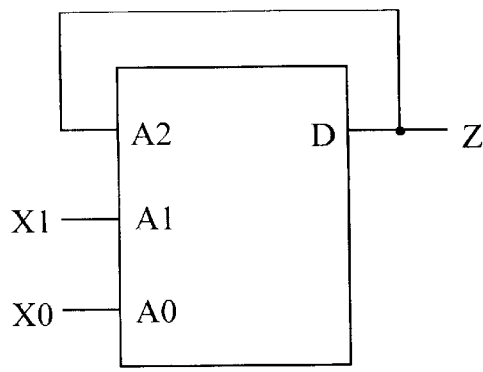
FIG. 1 illustrates connections for a 3-input general purpose FPGA programmed as a 2-of-2 threshold gate with hysteresis.

FIG. 1 illustrates connections for a general purpose FPGA programmed as a 2-of-2 threshold gate. The FPGA includes three inputs A0, A1, A2 and an output D. Output D is connected to input A2. Logic signals X0, X1 are applied to inputs A0, A1 respectively. If a Xilinx 4000-series FPGA is used, inputs A0, A1, and A2 of FIG. 1 would correspond to inputs F1, F2, F3 of the Xilinx device. Output D of FIG. 1 would correspond to output X of the Xilinx device. Xilinx device signal voltage level of 0 volts (ground voltage) that normally signifies Boolean logic state false ("0") will instead signify NULL. Xilinx device signal voltage level of supply voltage that normally signifies Boolean logic state true ("1") will instead signify meaningful DATA.

Table 1 illustrates an input/output relationship that programs the FPGA of FIG. 1 to function as a 2-of-2 gate with hysteresis.

TABLE 1

| A2 | A1 | A0 | D |
|----|----|----|---|
| 0  | 0  | 0  | 0 |
| 0  | 0  | 1  | 0 |
| 0  | 1  | 0  | 0 |
| 0  | 1  | 1  | 1 |
| 1  | 0  | 0  | 0 |
| 1  | 0  | 1  | 1 |
| 1  | 1  | 0  | 1 |
| 1  | 1  | 1  | 1 |

For brevity of notation, an entry "0" in the table indicates a signal in the NULL state (ground voltage), and an entry "1" indicates a signal in the DATA state (power supply voltage). The output D will switch from NULL (0) to DATA (1) when both logic signals (X0, X1 applied to inputs A0, A1) are DATA (1). The output D will remain DATA (1) as long as at least one of the inputs A0, A1 remains 1 (DATA). The output D will switch to NULL (0) when both inputs A0, A1 are NULL.

The look-up table address space divides into two contiguous domains. The lower 4 address locations (rows) correspond to states in which the current data output D is NULL (0), while the upper 4 addrsss locations correspond to states in shich the current data output D is DATA (1). This partition reflects the effect of connecting the output D to input A2. The output D, which in connected to input A2, can be seen as one input for the purpose of satisfying the threshold requirement. All feedback connections can be visualized as having a weight of M−1 inputs for the purpose of satisfying this threshold requirement. This feedback provides the hysteresis characteristic.

Figure 2:
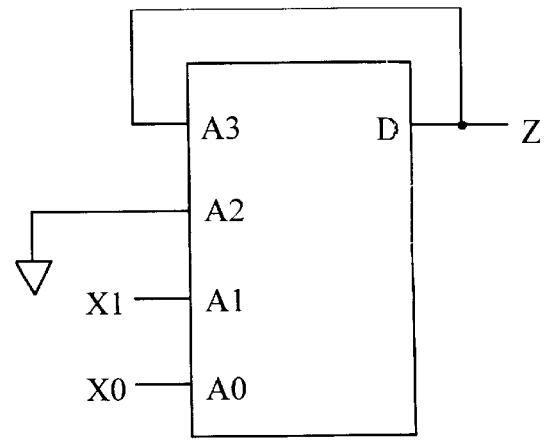
FIG. 2 illustrates connections for a 4-input general purpose FPGA programmed as a 2-of-2 threshold gate with hysteresis.

The embodiment described above utilizes an 8-state look-up table. A device with a larger look-up table can be adapted to function as a 2-of-2 threshold gate by tying one or more of the unused external inputs to ground 0 (or power supply 1), and by programming 0 (or 1) in the corresponding column of the look-up table. FIG. 2 illustrates connections for a 4-input FPGA programmed as a 2-of-2 threshold gate. Table 2 illustrates an input/output relationship that programs the FPGA of FIG. 2 to function as a 2-of-2 gate with hysteresis.

TABLE 2

| A3 | A2 | A1 | A0 | D |
|----|----|----|----|---|
| 0  | 0  | 0  | 0  | 0 |
| 0  | 0  | 0  | 1  | 0 |
| 0  | 0  | 1  | 0  | 0 |
| 0  | 0  | 1  | 1  | 1 |

TABLE 2-continued

| A3 | A2 | A1 | A0 | D |
|---|---|---|---|---|
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

In FIG. 2, unused input A2 is tied to ground. In Table 2, half of the rows have a DATA (1) entry for input A2, and half have a NULL (ground) entry. Because the hardware input is tied to ground, the only states in TABLE 2 that actually will be realized in operation are those having NULL in the A2 column.

Alternate embodiments of threshold gates implemented with FPGA devices will be described below using similar conventions as for the examples above.

Figure 3:
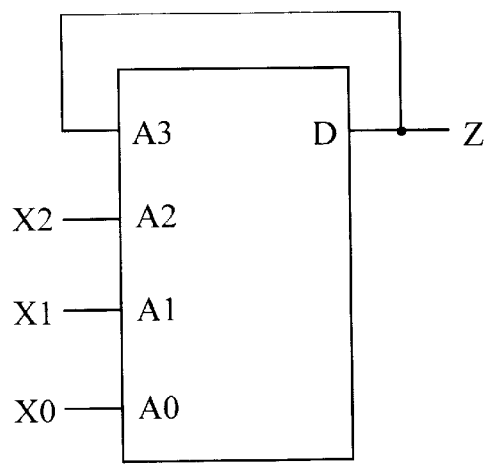
FIG. 3 illustrates connections for a general purpose FPGA programmed as a 2-of-3 threshold gate with hysteresis.

FIG. 3 illustrates connections for a general purpose FPGA programmed as a 2-of-3 threshold gate. The preferred implementation uses a 16-state look-up table programmed as shown in Table 3. Any combination of 2 or more DATA (1) inputs A0, A1, A2, A3 produces a DATA (1) output signal.

TABLE 3

| A3 | A2 | A1 | A0 | D |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 1 |
| 0 | 1 | 1 | 0 | 1 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

Figure 4:
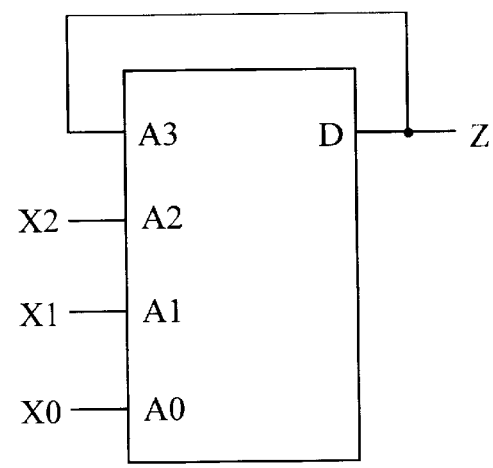
FIG. 4 illustrates connections for a general purpose FPGA programmed as a 3-of-3 threshold gate with hysteresis.

FIG. 4 illustrates connections for a general purpose FPGA programmed as a 3-of-3 threshold gate. The preferred implementation uses the 16-state bit look-up table shown in Table 4.

TABLE 4

| A3 | A2 | A1 | A0 | D |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 0 |
| 1 | 0 | 1 | 0 | 0 |

TABLE 4-continued

| A3 | A2 | A1 | A0 | D |
|---|---|---|---|---|
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

Figure 5:
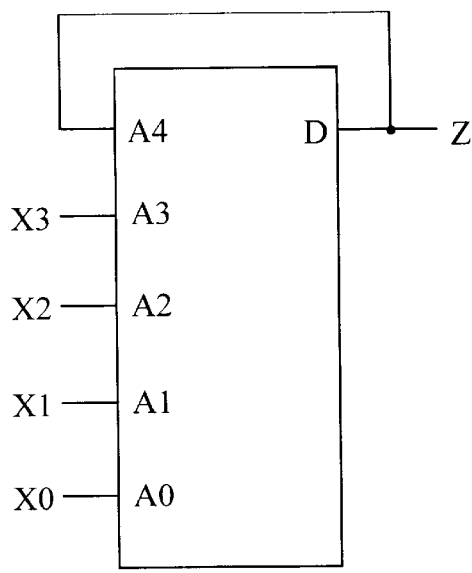
FIG. 5 illustrates connections for a general purpose FPGA programmed as a 4-of-4 threshold gate with hysteresis.

FIG. 5 illustrates connections for a general purpose FPGA programed as a 4-of-4 threshold gate. The preferred implementation uses the look-up table shown in Table 5.

TABLE 5

| A4 | A3 | A2 | A1 | A0 | D |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 0 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 0 |
| 0 | 1 | 1 | 0 | 1 | 0 |
| 0 | 1 | 1 | 1 | 0 | 0 |
| 0 | 1 | 1 | 1 | 1 | 1 |
| 1 | 0 | 0 | 0 | 0 | 0 |
| 1 | 0 | 0 | 0 | 1 | 1 |
| 1 | 0 | 0 | 1 | 0 | 1 |
| 1 | 0 | 0 | 1 | 1 | 1 |
| 1 | 0 | 1 | 0 | 0 | 1 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 1 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 1 | 1 |

Figure 6:
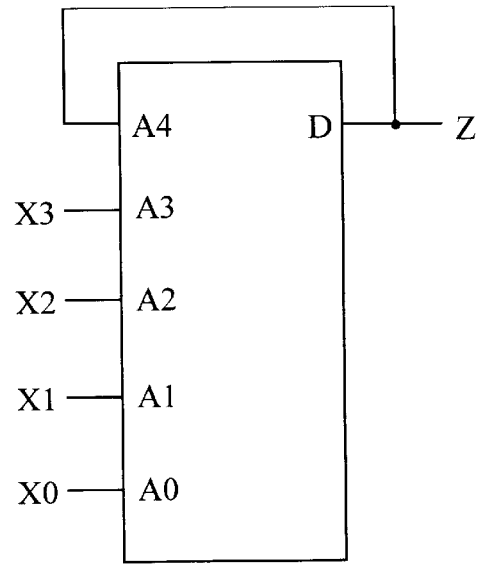
FIG. 6 illustrates connections for a general purpose FPGA programmed as an adder-type 3-of-5 threshold gate with hysteresis, where one input has a weight of 2.

FIG. 6 illustrates connections for a general purpose FPGA programed as an adder-type 3-of-5 threshold gate with the A3 input having a weight of 2. If the A3 input and any one of the other inputs A0, A1, or A2 are DATA, then the threshold level of three is met and the output is asserted. The preferred implementation uses the look-up table shown in Table 6. Such gates can be used in an asynchronous adder of the type disclosed in U.S. application Ser. No. 08/483,557, which is incorporated herein by reference in its entirety.

TABLE 6

| A4 | A3 | A2 | A1 | A0 | D |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 1 |

TABLE 6-continued

| A4 | A3 | A2 | A1 | A0 | D |
|----|----|----|----|----|---|
| 0 | 1 | 0 | 1 | 0 | 1 |
| 0 | 1 | 0 | 1 | 1 | 1 |
| 0 | 1 | 1 | 0 | 0 | 1 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 1 |
| 1 | 0 | 0 | 1 | 0 | 1 |
| 1 | 0 | 0 | 1 | 1 | 1 |
| 1 | 0 | 1 | 0 | 0 | 1 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 1 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 1 | 1 |

Figure 7:
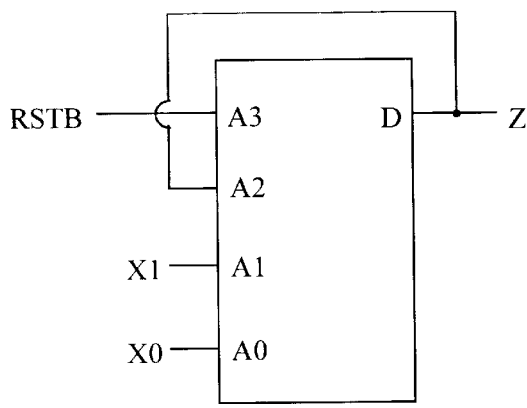
FIG. 7 illustrates connections for a general purpose FPGA programmed as a 2-of-2 threshold gate with hysteresis with active-low reset to NULL.

FIG 7 illustrates connections for a general purpose FPGA programed as a 2-of-2 threshold gate with active-low reset to NULL. The preferred implementation uses the 16-state look-up table shown in Table 7.

TABLE 7

| A3 | A2 | A1 | A0 | D |
|----|----|----|----|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

When the RSTB signal input to input A3 is NULL (0), the D output is forced to NULL (0) regardless of the values of the D output and of the external inputs. When the RSTB signal is DATA (1), the device functions normally as a 2-of-2 gate. Gates having any combination of numbers of input, and thresholds (i.e., varying M and N values for an M-of-N gate) can be adapted similarly with a reset to NULL Capability.

Figure 8:
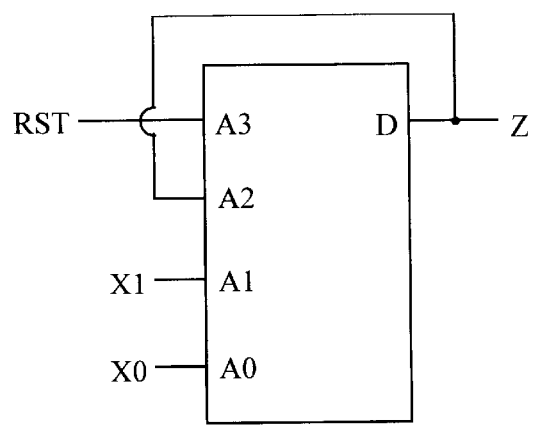
FIG. 8 illustrates connections for a general purpose FPGA programmed as a 2-of-2 threshold gate with hysteresis with active-high reset to DATA.

FIG. 8 illustrates connections for a general purpose FPGA programed as a 2-of-2 threshold gate with active-high reset to DATA. The preferred implementation uses the 16-state look-up table shown in Table 8.

TABLE 8

| A3 | A2 | A1 | A0 | D |
|----|----|----|----|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 1 |
| 0 | 1 | 1 | 0 | 1 |
| 0 | 1 | 1 | 1 | 1 |
| 1 | 0 | 0 | 0 | 1 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

When the RST signal input to A3 is DATA (1), the D output is forced to DATA (1) regardless of the previous values of data output D and of the external inputs. When RST signal is NULL (0), the device operates normally as a 2-of-2 threshold operation. Gates having varying values of M and N can be adapted similarly with a reset to DATA capability.

Several illustrative threshold gate implementation examples have been disclosed herein. With the teaching of these examples, those skilled in the art will be capable of modifying the disclosed gates to achieve additional gates with varying combination of thresholds, numbers of inputs, weights, set capabilities, reset capabilities, and other characteristics of gates and circuits described in other applications referenced herein. Furthermore, mask programmable gate arrays, and FPGAs that are programmed through methods other than look-up tables can be adapted to function as asynchronous threshold gates after the table-based programming disclosed herein is understood. The present invention has been described with reference to particular preferred embodiments, but various modifications and variations can be made that will be apparent to those in the art and which will fall within the scope of the present invention as defined by the appended claims.

What is claimed is:

1. A method of using a programmable logic array to implement a NULL convention logic circuit, comprising the steps of:

choosing a programmable logic array having at least one nominal level threshold gate and at least one higher level threshold gate;

connecting the elements of said logic array to form a threshold gate circuit, said threshold gate circuit having a switching characteristic in which:

the threshold gate circuit switches its output to a NULL state when all of a plural number of inputs "n" are NULL;

the threshold gate circuit switches its output to an ASSERTED state when a plural number of ASSERTED inputs exceeds a threshold number "m," wherein "m" is less than or equal to "n;" and the threshold gate maintains a non-NULL output when a number of ASSERTED inputs falls to less than "m" and greater than zero (0).

* * * * *